(12) United States Patent
Zhou et al.

(10) Patent No.: US 7,244,313 B1
(45) Date of Patent: Jul. 17, 2007

(54) PLASMA ETCH AND PHOTORESIST STRIP PROCESS WITH INTERVENING CHAMBER DE-FLUORINATION AND WAFER DE-FLUORINATION STEPS

(75) Inventors: Yifeng Zhou, San Jose, CA (US);
Gerardo A. Delgadino, Santa Clara, CA (US); Chang-Lin (Peter) Hsieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/388,363

(22) Filed: Mar. 24, 2006

(51) Int. Cl.
*B08B 3/12* (2006.01)
*B08B 6/00* (2006.01)
*B08B 7/00* (2006.01)
*B08B 7/02* (2006.01)

(52) U.S. Cl. .................... 134/1; 134/1.1; 134/1.2; 134/1.3

(58) Field of Classification Search ............... None
See application file for complete search history.

(56) References Cited

U.S. PATENT DOCUMENTS

| 6,051,505 A | 4/2000 | Chu et al. ............... 438/710 |
| 6,528,751 B1 | 3/2003 | Hoffman et al. ....... 219/121.43 |
| 6,548,230 B1 * | 4/2003 | Liou ...................... 430/329 |
| 6,756,087 B2 * | 6/2004 | Terada ..................... 427/558 |
| 2004/0005517 A1 * | 1/2004 | Gu et al. .................. 430/314 |
| 2005/0202683 A1 | 9/2005 | Wang et al. .............. 438/763 |
| 2006/0024945 A1 | 2/2006 | Kim et al. ................. 48/618 |
| 2006/0270239 A1 | 11/2006 | Triyoso et al. ........... 438/706 |

* cited by examiner

Primary Examiner—Duy-Vu N Deo
(74) Attorney, Agent, or Firm—Robert M. Wallace

(57) ABSTRACT

A plasma etch process includes a plasma etch step performed with a photoresist mask on a workpiece using a polymerizing etch process gas that produces in the plasma polymerizing species which accumulate as a protective polymer layer on the surface of said photoresist mask during the etch step, the process including the following steps performed in the same chamber after the etch step and prior to removing the photoresist mask:

(a) removing residue of the type including polymer material from chamber surfaces including a ceiling of said chamber, by coupling RF plasma source power into the chamber while coupling substantially no RF plasma bias power into the chamber, and introducing a hydrogen-containing gas into the chamber, until said residue is removed from the chamber surfaces;

(b) removing the protective polymer layer from the surface of the photoresist mask, by coupling RF plasma bias power into the chamber while coupling substantially no RF plasma source power into the chamber, and introducing into the chamber a process gas comprising oxygen and carbon monoxide, until the polymer layer is removed from the surface of the photoresist mask.

19 Claims, 3 Drawing Sheets

PLASMA ETCH AND PHOTORESIST STRIP PROCESS WITH INTERVENING CHAMBER DE-FLUORINATION AND WAFER DE-FLUORINATION STEPS

BACKGROUND OF THE INVENTION

Integrated circuit performance is being continually improved by increasing device switching speed, increasing interconnection density and reducing cross-talk between adjacent conductors that are separated by inter-metal dielectric (IMD) layers. Switching speeds have been increased and cross-talk reduced by employing new dielectric thin film material as the IMD having low dielectric constant ("low-k material"), such as porous organo-silicate glass. Interconnections have been increased by increasing the number of interconnected conductive layers and reducing feature size (e.g., line widths, hole diameters). Connecting between different conductors entails high aspect ratio (deep and narrow) openings or "vias" through the low-k material. Such fine features (e.g., having feature sizes on the order of 45 nm) have required photoresist (for photolithography) adaptable to higher wavelengths. Such photoresist tends to be thinner and more prone to form imperfections such as pin holes or striations during the dielectric etch process. This problem is addressed by employing a fluorocarbon chemistry during the plasma etch formation of narrow vias though the low-k dielectric film. The fluorocarbon etch chemistry deposits a protective fluorocarbon polymer on the photoresist. The etch process typically must stop upon reaching a bottom dielectric layer overlying copper interconnection lines. This bottom dielectric layer typically serves as a barrier layer preventing diffusion of copper atoms from the conductor line, and is itself a low-k dielectric material, such as nitrogen-doped silicon carbide, and is typically very thin (on the order of hundreds of Angstroms). After the barrier layer has been exposed, the etch process is halted, having formed a deep narrow (high aspect ratio) opening or via. In preparation for the next process step, the photoresist is stripped from the wafer. This photoresist strip process can be done in an ammonia-based plasma with bias power applied to the wafer, and is performed in the same chamber in which the preceding etch process was performed, in order to avoid an unnecessary wafer transfer step and maximize productivity. The problem is that the photoresist strip process causes the thin barrier layer at the via bottom, consisting of the vulnerable low-k material, to disappear.

One way around this problem may be to transfer the wafer to a dedicated photoresist ashing chamber before performing the photoresist ashing step. Unfortunately, such an approach would reduce productivity because of the delays inherent in the transferring of the wafer between reactor chambers.

Therefore, there is a need for a combination via etch and photoresist strip process in which the thin barrier at the via bottom is preserved.

SUMMARY OF THE INVENTION

A plasma etch process includes a plasma etch step performed with a photoresist mask on a workpiece using a polymerizing etch process gas that produces in the plasma polymerizing species which accumulate as a protective polymer layer on the surface of said photoresist mask during the etch step, the process including the following steps performed in the same chamber after the etch step and prior to removing the photoresist mask:

removing residue of the type including polymer material from chamber surfaces including a ceiling of said chamber, by coupling RF plasma source power into the chamber while coupling substantially no RF plasma bias power into the chamber, and introducing a hydrogen-containing gas into the chamber, until said residue is removed from the chamber surfaces;

removing the protective polymer layer from the surface of the photoresist mask, by coupling RF plasma bias power into the chamber while coupling substantially no RF plasma source power into the chamber, and introducing into the chamber a process gas comprising oxygen and carbon monoxide, until the polymer layer is removed from the surface of the photoresist mask.

DETAILED DESCRIPTION OF THE INVENTION

The problem of removal of the low-k via bottom barrier layer by the photoresist strip process is solved in the plasma etch and photoresist strip process of the present invention. The present invention is based upon the inventors' realization that the problem of removal of the barrier layer during photoresist strip arises from the presence of fluorine-containing residues both on the chamber interior surfaces and on the wafer itself at commencement of the post-etch photoresist removal step. The photoresist strip process liberates fluorine compounds (and free fluorine) from the residues deposited during the etch process. Hydrogen present in the ammonia-based plasma used to strip the photoresist cooperates with the liberated fluorine compounds to produce a highly reactive plasma etch of the low-k barrier layer. The process of the present invention eliminates this problem.

Figure 1:
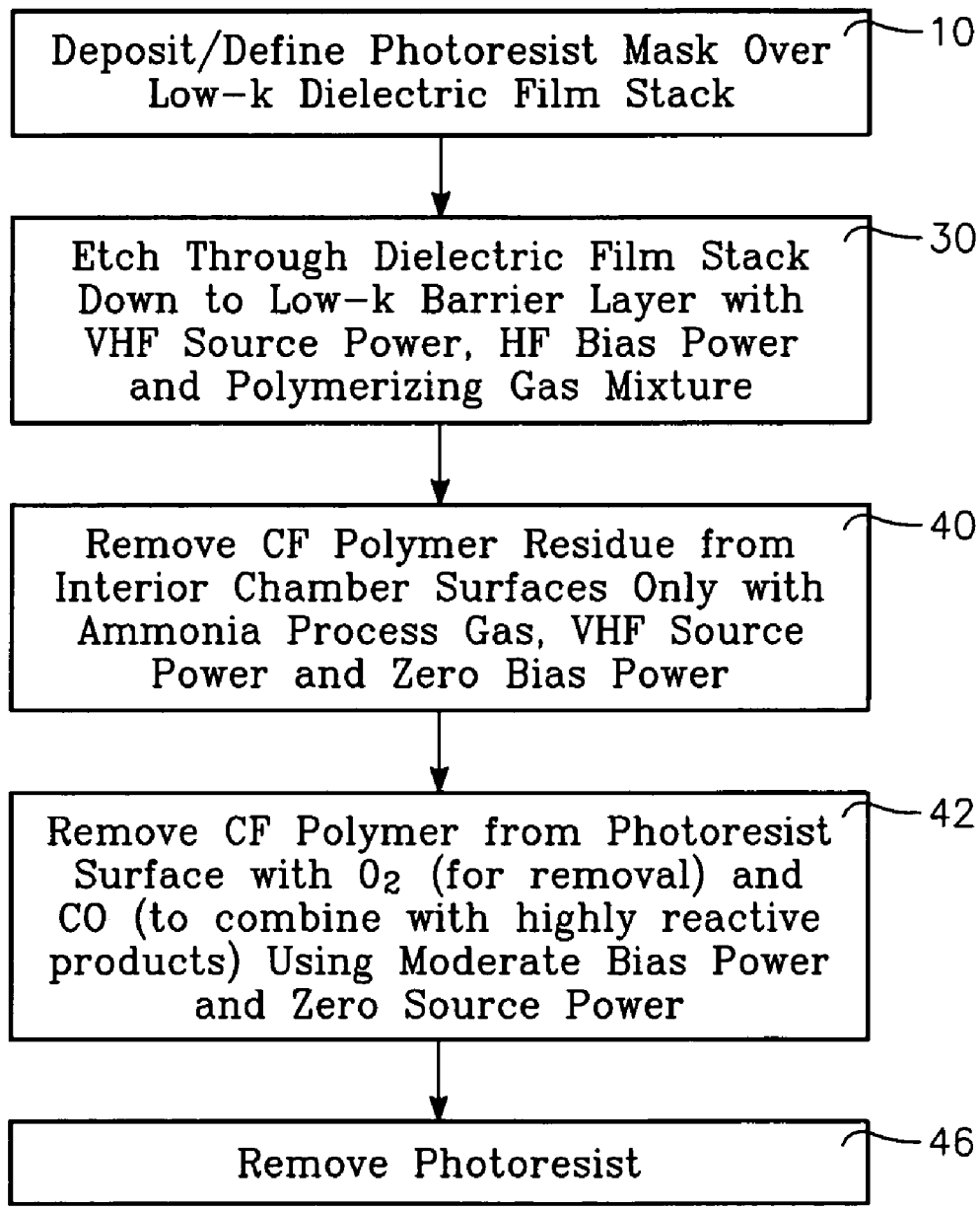
FIG. 1 is a block flow diagram of a process embodying the invention.
Figure 2A:
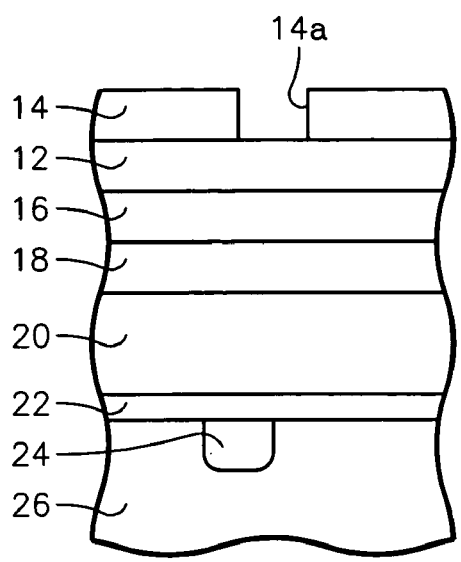
FIGS. 2A, 2B, 2C and 2D depict in chronological order the changes in a thin film structure during successive steps of the process of FIG. 1.

Referring now to FIG. 1, a photoresist mask is photolithographically defined on the top surface of a thin film structure (block 10 of FIG. 1). This thin film structure at this stage of the process is illustrated in FIG. 2A. The thin film structure of FIG. 2A consists of an anti-reflection coating 12 that is covered by the photoresist layer 14 deposited in the step of block 10 of FIG. 1, with an aperture 14a defined photolithographically in the photoresist layer 14. A silicon dioxide-containing dielectric layer 16 underlies the anti-reflection coating 12, an organo-silicate glass layer 18 underlying the dielectric layer 16 and a thick porous organo-silicate glass layer 20 (a low-k dielectric material) underlying the organo-silicate glass layer 18. A thin diffusion barrier layer 22 underlies the porous organo-silicate glass layer 20, and consists of a low-k dielectric material capable of resisting or blocking diffusion of copper atoms, such as nitrogen-doped silicon carbide. A copper conductor line 24 surrounded by an oxide layer 26 underlies the barrier layer 22.

Figure 2B:
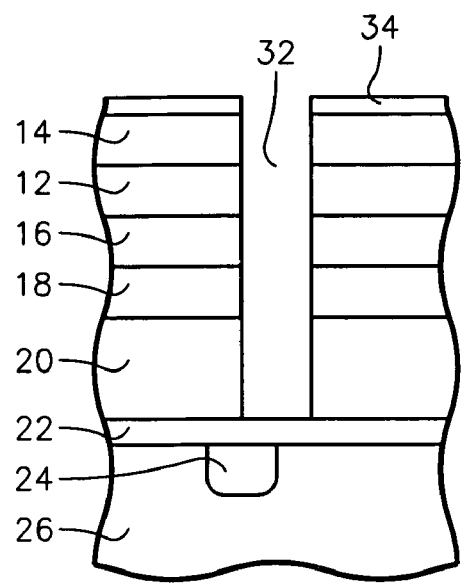

In the next step (block 30 of FIG. 1), a fluorocarbon or fluoro-hydrocarbon process gas flows into the reactor chamber while plasma RF source power and plasma RF bias power is applied to form a plasma at a relatively low chamber pressure (e.g., on the order of milliTorr). This condition is maintained in the chamber until a via opening 32 is opened through the thin film structure of FIG. 2B down to the top surface of the barrier layer 22. FIG. 2B depicts the thin film structure upon the completion of the step of block 30 of FIG. 1. During the etching step of block 30 of FIG. 1, some of the process gas forms simple (high fluorine-content) fluorocarbon etchant species that carry out the formation of the via opening 32 (FIG. 2B). Simultaneously, other carbon-rich fluorocarbon species are formed that accumulate as a polymer layer 34 on the top surface of the photoresist layer 14 (FIG. 2B) and as a polymer layer on interior surfaces of the reactor chamber (not shown in FIG. 2B).

In block 40 of FIG. 1, a step is performed prior to removal of the photoresist layer 14 that removes fluorine-containing polymer from the reactor chamber interior surfaces without harming or removing the vulnerable thin barrier layer 22. This is accomplished by removing the bias power on the wafer and then replacing the fluorocarbon or fluoro-hydrocarbon process gas in the reactor chamber with ammonia gas. The plasma RF source power dissociates the ammonia sufficiently for hydrogen from the ammonia process gas to react with fluorine and carbon atoms in the polymer on the interior chamber surfaces to thereby remove the polymer from those surfaces. The RF bias power on the wafer is set to zero (or sufficiently close to zero) to avoid plasma generated from the ammonia gas from reaching down the narrow via openings to attack the thin barrier layer 22. As a result, this step can be carried out for a sufficient time to guarantee thorough removal of accumulated polymer from interior chamber surfaces.

Figure 2C:
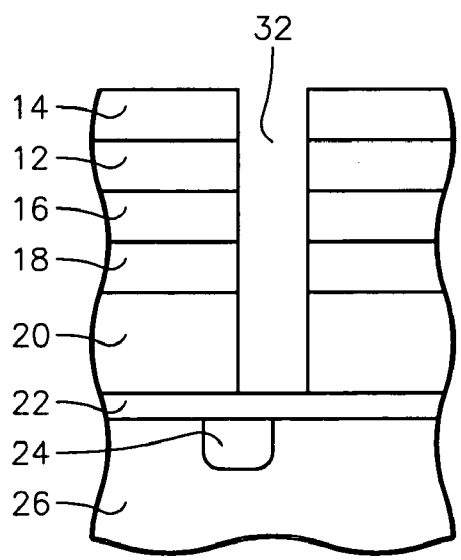

In block 42 of FIG. 1, another step is performed prior to removal of the photoresist layer 14 that removes the fluorine-containing polymer layer 34 from the top surface of the photoresist layer 14 without harming or removing the vulnerable and thin barrier layer 22 at the bottom of the via 32. This is accomplished by removing the RF source power and applying RF bias power to the wafer. Also, a process gas environment is established within the reactor chamber consisting of oxygen and carbon monoxide and free of any hydrogen-containing or fluorine-containing compounds. For example, while the order in which the steps of blocks 40 and 42 are performed may be reversed, if the step of block 42 is performed after the step of block 40, then the proper gas environment is established by removing the ammonia process gas completely, removing the RF plasma source power, flowing oxygen and carbon monoxide into the reactor chamber and applying RF plasma bias power to the wafer. The lack of RF plasma source power limits (or prevents) dissociation of the oxygen molecules. The undissociated oxygen does not attack the thin barrier layer 22 but it does attack the polymer layer 34 on the surface of the photoresist layer 14. The reaction of the oxygen with the polymer layer 34 removes the polymer layer 34, to produce the structure depicted in FIG. 2C, while generating some highly reactive (low carbon-content) fluorocarbon-containing species in the plasma that could attack the delicate barrier layer 22. Such an attack is prevented by the presence of the carbon monoxide atoms in the process gas. The carbon monoxide atoms react quickly combine with the low carbon-content reactive species generated in this step to convert such reactive species into more inert carbon-rich fluorocarbon species that do not attack the vulnerable barrier layer 22.

Figure 2D:
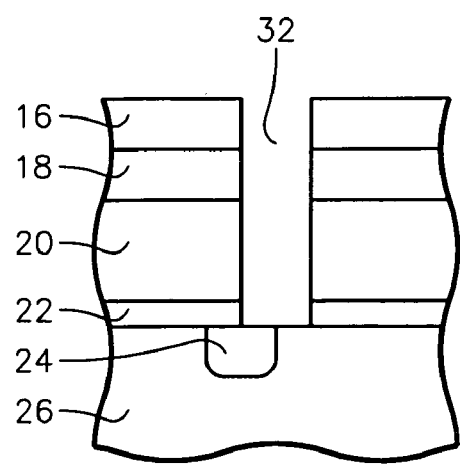

In the final step (block 46 of FIG. 1), the photoresist layer 14 is removed in the same reactor chamber. The resist strip or removal step of block 46 is performed typically by removing the oxygen and carbon monoxide process gas and introducing ammonia gas and applying RF plasma source power to the reactor overhead electrode and applying RF plasma bias power to the wafer. Because all fluorine-containing deposits have been removed from both the chamber interior surfaces and from the wafer itself, the plasma environment is devoid of fluorine, and so the hydrogen liberated during this last step (photoresist removal) does not damage the exposed barrier layer 22. This step also removes the antireflective coating or layer 12. The photoresist removal step of block 46 is carried out for a sufficient time to guarantee photoresist removal, and results in the thin film structure depicted in FIG. 2D.

In tests we have performed of the process of FIG. 1, we have found that the loss of material from the barrier layer 22 is 2 nm or less, which is a negligible amount, thus permitting the reduction of feature size on the wafer to 45 nm.

Figure 3:
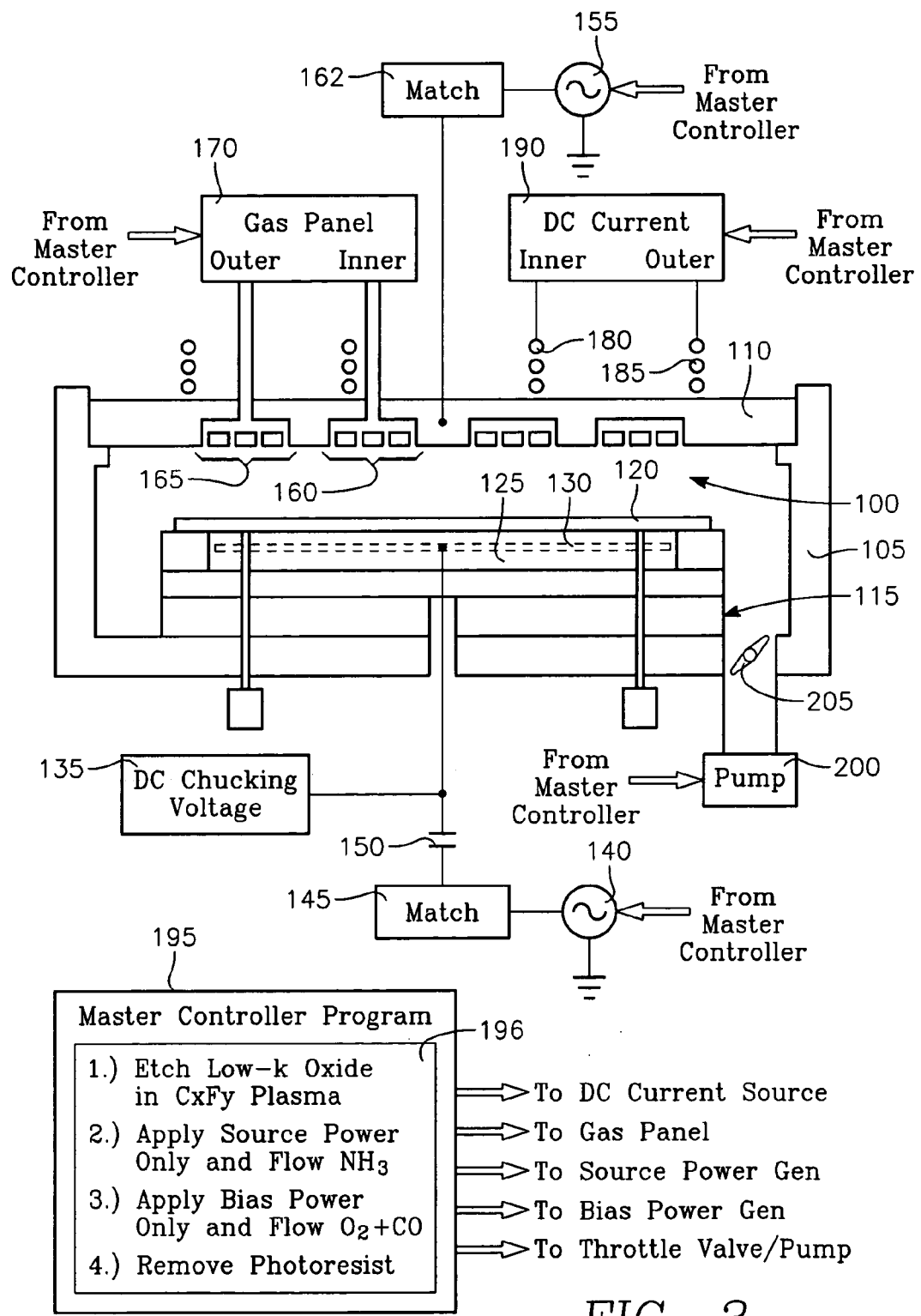
FIG. 3 depicts a plasma reactor of the type suited for carrying out the process of FIG. 1 and having a controller programmed to execute the process of FIG. 1.

FIG. 3 depicts a plasma reactor for carrying out the process of FIG. 1. The reactor of FIG. 3 has a vacuum chamber 100 defined by a cylindrical side wall 105 and a disk-shaped ceiling electrode 110. An electrostatic chuck 115 supporting the wafer 120 includes an insulator layer 125 having an internal electrode 130 coupled to a D.C. chucking voltage supply 135. An RF plasma bias power generator 140 is coupled to the electrode 130 through an impedance match element 145 and an isolation capacitor 150. A VHF (e.g., 162 MHz) RF source power generator 155 is coupled through an impedance match element 162 to the ceiling electrode 110. The impedance match element may be a coaxial tuning stub that is resonant near the frequency of the VHF generator 155, the electrode 110 having a reactance that forms a resonance with plasma in the chamber 100 near the frequency of the VHF generator 155, as disclosed in U.S. Pat. No. 6,528,751 issued on Mar. 4, 2003 entitled PLASMA REACTOR WITH OVERHEAD RF ELECTRODE TUNED TO THE PLASMA by Daniel Hoffman et al. and assigned to the present assignee, the disclosure of which is incorporated herein by reference. The ceiling electrode 110 is also a gas distribution showerhead. Process gases flow into the chamber 100 through an inner zone 160 of gas distribution orifices in the ceiling electrode 110 and an outer zone 165 of gas distribution orifices. A gas panel 170 provides selected process gases and apportions the gas flow between the inner and outer zones 160, 165. Inner and outer electromagnets 180, 185 control plasma ion density distribution within the chamber 100 in accordance with D.C. currents applied to them from a D.C. current supply 190. A vacuum pump 200 modulated by a throttle valve 205 establishes a desired vacuum chamber pressure in the chamber 100. A master controller 195 is programmed with a set of instructions 196 to perform a process sequence of the type depicted in FIG. 1, and for that purpose controls the operation of the gas panel 170, the D.C. magnet current supply 190, the VHF source power generator 155, the RF bias power generator 140 and the throttle valve 205. In this case, the instruction set 196 with which the master controller 195 is programmed are as follows: (1) furnish a fluorocarbon process gas from the gas panel 170, apply bias and source power to etch a via opening through a low-k dielectric layer; (2) apply source power, turn off bias power and fill the chamber with ammonia gas from the gas panel 170 to remove accumulated polymer from interior chamber surfaces; (3) apply bias power, turn off source power and fill the chamber with oxygen and carbon monoxide process gas from the gas panel 170 to remove deposited polymer from the wafer; and (4) remove photoresist from the wafer.

In a working example, the step of block 40 of FIG. 1 is performed with 300 sccm flow rate of ammonia to the showerhead or ceiling electrode 110, source power of 400 Watts from the VHF generator, a chamber pressure of 10 mT, a ratio of 1.35 between the flow rate of the inner zone 160 to the outer zone 165, a D.C. current of 14 amperes applied to the inner electromagnet only, and a process time for this step of 30 seconds. The step of block 42 was performed with a flow rate of oxygen gas of 100 sccm, carbon monoxide gas of 50 sccm, zero source power, RF bias power of 100 Watts with sources of 2 MHz and 13.56 MHz, a chamber pressure of 5 mT, a ratio of 1.35 between the inner and outer zone flow rates, a 14 ampere D.C. current applied to the inner magnet only, and a process time for this step of 60 seconds.

While the invention has been described in detail by specific reference to preferred embodiments, it is understood that variations and modification thereof may be made without departing from the true spirit and scope of the invention.

What is claimed is:

1. A plasma etch process for a workpiece having a low-dielectric constant thin film that is exposed during the etch process, said process comprising:
    forming a photoresist mask on a top surface of the workpiece, said mask including apertures defining hole locations to be etched;
    placing the workpiece in a plasma reactor chamber;
    performing an etch step by introducing into the chamber a polymerizing etch process gas of type comprising a fluorocarbon or fluoro-hydrocarbon species and coupling RF plasma source power and RF plasma bias power into the chamber to produce a plasma of: (a) etch species which etch holes in said workpiece in registration with the apertures in said photoresist mask, and (b) polymerizing species which accumulate as a polymer layer on the surface of said photoresist mask during said etch step;
    prior to removing the photoresist mask:
        (a) removing residue of the type including polymer material from chamber surfaces including a ceiling of said chamber, by coupling RF plasma source power into said chamber while coupling substantially no RF plasma bias power into said chamber, and introducing a hydrogen-containing gas into said chamber, until said residue is removed from the chamber surfaces;
        (b) removing said polymer layer from the surface of said photoresist mask, by coupling RF plasma bias power into said chamber while coupling substantially no RF plasma source power into said chamber, and introducing into the chamber a process gas comprising oxygen and carbon monoxide, until said polymer layer is removed from the surface of said photoresist mask; and
    stripping said photoresist off of said workpiece.

2. The process of claim 1 wherein, in the step of removing residue from chamber surfaces, said hydrogen-containing gas is ammonia.

3. The process of claim 1 wherein, in said etch step and in the step of removing residue from chamber surfaces, the step of coupling RF plasma source power into the chamber comprises capacitively coupling RF power through a ceiling electrode of said chamber that overlies said workpiece.

4. The process of claim 3 wherein, in said etch step and the step of removing said polymer layer from the photoresist mask, the step of applying RF plasma bias power comprises coupling at least one of HF and LF power to said workpiece.

5. The process of claim 3 wherein said RF plasma source power is of a VHF frequency between about 50 MHz and 300 MHz.

6. The process of claim 5 wherein said RF plasma source power is about 162 MHz.

7. The process of claim 4 wherein said RF plasma bias power comprises an HF component of about 13.56 MHz and an LF component of about 2 MHz.

8. The process of claim 1 wherein the step of stripping said photoresist comprises coupling RF plasma source power and RF plasma bias power into said chamber, and introducing a hydrogen-containing gas into said chamber, until said resist is removed from said workpiece.

9. The process of claim 8 wherein the hydrogen-containing gas of the step of stripping said photoresist is ammonia.

10. The process of claim 1 wherein, in the step of removing residue from chamber surfaces, said RF plasma bias power is of a sufficiently small level to avoid directing plasma ions to the bottom of openings in said workpiece formed by said etch step.

11. The process of claim 10 wherein said sufficiently small level is zero.

12. The process of claim 1 wherein, in the step of removing said polymer layer from said photoresist mask, said RF plasma source power is of a sufficiently small magnitude to avoid dissociating oxygen species in said chamber.

13. The process of claim 12 wherein said sufficiently small magnitude is zero.

14. The process of claim 1 wherein the step of removing residue from chamber surfaces further comprises maintaining a low chamber pressure on the order of about 10 mT and a high flow rate of said nitrogen-containing process gas on the order of about 300 sccm.

15. The process of claim 1 wherein the step of removing the polymer layer from the photoresist comprises maintaining a low chamber pressure on the order of about 5 mT and flow rates of oxygen and carbon monoxide of about 100 sccm and 50 sccm respectively.

16. The process of claim 1 wherein said low-dielectric constant thin film is a diffusion barrier layer underlying other thin film layers of said workpiece, and wherein said process comprises halting said etch step upon exposure of said diffusion barrier layer.

17. The process of claim 16 wherein said other thin film layers comprise low-dielectric constant materials of the type comprising a porous organo-silicate glass.

18. The process of claim 17 wherein said diffusion barrier layer overlies a metal line of said workpiece, and wherein said diffusion barrier layer comprises a low-dielectric constant material capable of blocking diffusion of material from said metal line of the type comprising nitrogen-doped silicon carbide.

19. A plasma etch process that includes a plasma etch step performed with a photoresist mask on a workpiece using a polymerizing etch process gas that produces in the plasma polymerizing species which accumulate as a polymer layer on the surface of said photoresist mask during said etch step, said process comprising the following steps performed after the etch step and prior to removing the photoresist mask:
    (a) removing residue of the type including polymer material from chamber surfaces including a ceiling of said chamber, by coupling RF plasma source power into said chamber while coupling substantially no RF plasma bias power into said chamber, and introducing a hydrogen-containing gas into said chamber, until said residue is removed from the chamber surfaces;
    (b) removing said polymer layer from the surface of said photoresist mask, by coupling RF plasma bias power into said chamber while coupling substantially no RF plasma source power into said chamber, and introducing into the chamber a process gas comprising oxygen and carbon monoxide, until said polymer layer is removed from the surface of said photoresist mask.

* * * * *